(12) United States Patent
Macheel et al.

(10) Patent No.: US 6,529,081 B1
(45) Date of Patent: Mar. 4, 2003

(54) METHOD OF OPERATING A SOLID STATE POWER AMPLIFYING DEVICE

(75) Inventors: Douglas M. Macheel, San Jose, CA (US); Peter B. Jones, Cupertino, CA (US); Lee B. Max, San Jose, CA (US)

(73) Assignee: Zeta, division of Sierra Tech Inc., San Jose, CA (US)

( * ) Notice: Subject to any disclaimer, the term of this patent is extended or adjusted under 35 U.S.C. 154(b) by 0 days.

(21) Appl. No.: 09/590,771

(22) Filed: Jun. 8, 2000

(51) Int. Cl.[7] ............................................... H03F 3/14
(52) U.S. Cl. .................................. 330/307; 330/66
(58) Field of Search ............................ 330/286, 302, 330/307, 66; 333/125, 128

(56) References Cited

U.S. PATENT DOCUMENTS

| | | | |
|---|---|---|---|
| 4,042,952 A | 8/1977 | Kraybill ..................... 357/68 |
| 4,053,722 A | 10/1977 | Nahay | |
| 4,107,728 A | 8/1978 | Max ........................... 357/80 |
| 4,193,083 A | 3/1980 | Max ........................... 357/80 |
| 4,198,652 A | 4/1980 | Parker | |
| 4,462,002 A | 7/1984 | Schade, Jr. | |
| 4,586,000 A | 4/1986 | Wagner | |
| 4,639,694 A | * 1/1987 | Seino et al. ................ 333/128 |
| 4,728,900 A | 3/1988 | Nakagawara et al. | |
| 5,117,203 A | 5/1992 | Tennyson ................... 330/294 |
| 5,142,239 A | 8/1992 | Brayton et al. ............. 350/66 |
| 5,352,998 A | * 10/1994 | Tanino ....................... 333/247 |
| 5,357,213 A | 10/1994 | Michel et al. ............. 330/286 |
| 5,371,405 A | 12/1994 | Kagawa ..................... 257/664 |
| 5,451,915 A | 9/1995 | Katzin et al. | |
| 5,455,539 A | 10/1995 | Mazoyer et al. | |
| 5,594,383 A | 1/1997 | Tamba | |
| 5,677,570 A | 10/1997 | Kondoh et al. ............ 257/690 |
| 5,717,249 A | 2/1998 | Yoshikawa ................. 257/728 |
| 5,723,906 A | 3/1998 | Rush .......................... 257/723 |
| 5,760,640 A | 6/1998 | Girard et al. | |
| 5,838,072 A | 11/1998 | Li et al. .................... 257/786 |
| 5,942,957 A | * 8/1999 | Mohwinkel et al. ....... 333/128 |
| 6,008,533 A | 12/1999 | Bruce et al. .............. 257/691 |
| 6,023,080 A | 2/2000 | Kojima ...................... 257/275 |
| 6,054,902 A | 4/2000 | Masato ....................... 330/306 |
| 6,087,721 A | 7/2000 | Akhnoukh ................. 257/705 |

FOREIGN PATENT DOCUMENTS

JP 405335436 A 12/1993

OTHER PUBLICATIONS

PCT Search Report, PCT/US01/19598, Oct. 2, 2001, 5 pps.

* cited by examiner

*Primary Examiner*—Steven J. Mottola
(74) *Attorney, Agent, or Firm*—Blakely, Sokoloff, Taylor & Zafman LLP

(57) ABSTRACT

According to one embodiment, a circuit is disclosed. The circuit comprises a solid state power amplifying device, an input impedance matching circuit and an output impedance matching circuit coupled to the solid state amplifying device. The input impedance matching circuit includes an input pitchfork trace pattern. The output impedance matching circuit includes an output pitchfork trace pattern. The circuit further discloses an input bias circuit and an output bias circuit.

26 Claims, 3 Drawing Sheets

METHOD OF OPERATING A SOLID STATE POWER AMPLIFYING DEVICE

FIELD OF THE INVENTION

This invention relates generally to the field of solid-state power amplifying devices.

BACKGROUND

It is widely known that improving output current balance of the die within solid-state, power amplifying devices results in performance improvement of gain, efficiency, peak output power and linearity. An area of amplifier performance enhancement that has heretofore been overlooked is the utilization and optimization of the amplifier circuit components to assist in balancing the output current distribution of the die of the amplifying device. Therefore, a method of balancing a solid state, power amplifying device is desired.

SUMMARY

According to one embodiment, a method of operating a power-amplifying device is disclosed. The method includes applying one or more circuit techniques in order to balance the output current of the solid state device.

BRIEF DESCRIPTION OF THE DRAWINGS

A better understanding of the present invention can be obtained from the following detailed description in conjunction with the following drawings, in which.

DETAILED DESCRIPTION

In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention.

Figure 1:
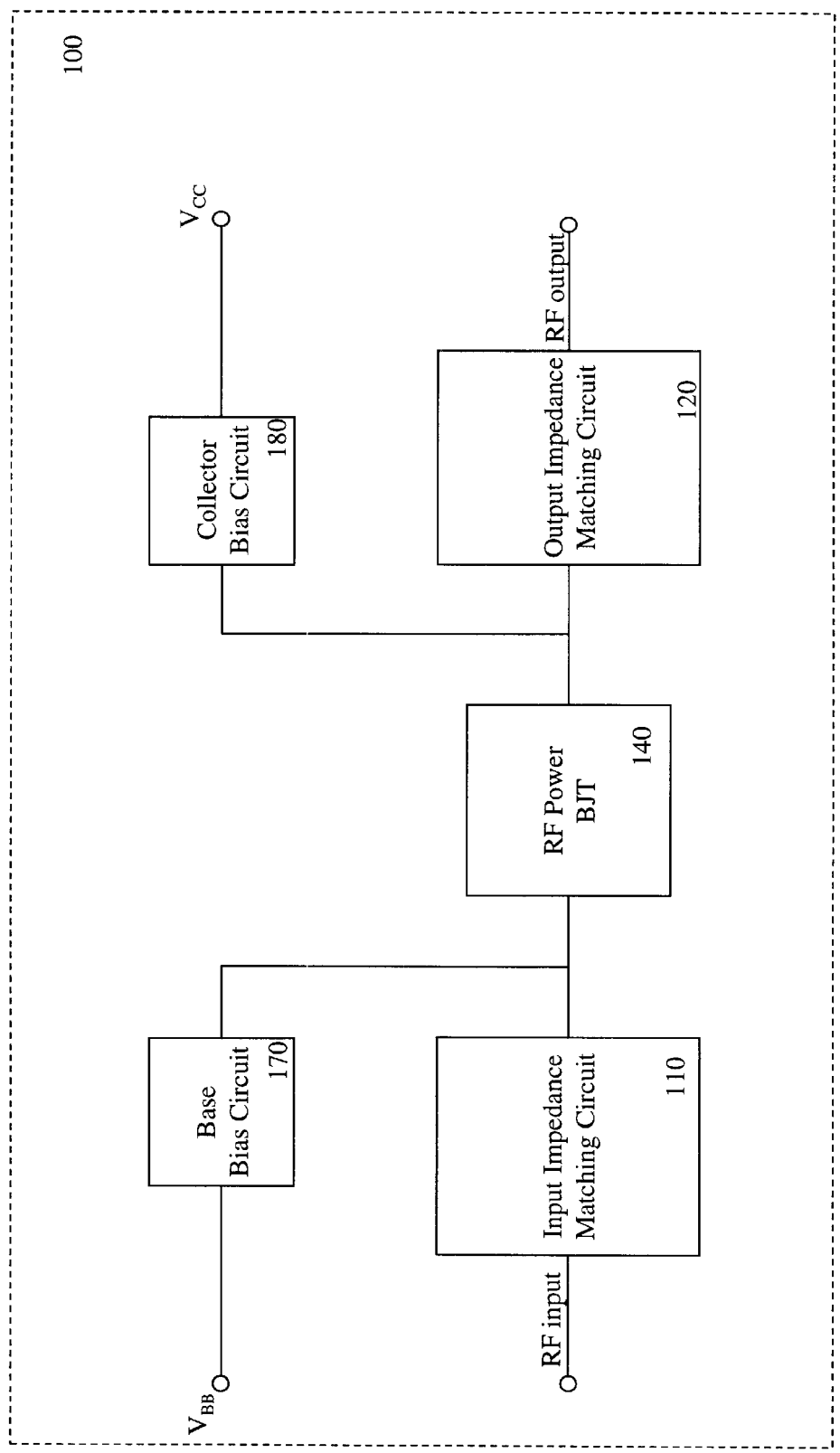
FIG. 1 is a block diagram of one embodiment of a radio frequency amplification circuit.

FIG. 1 is a block diagram of one embodiment of a radio frequency amplification circuit 100. Circuit 100 includes an input impedance matching circuit 110, an output impedance matching circuit 120, a radio frequency (RF) power bipolar junction transistor (BJT) 140, a base bias circuit 170 and a collector bias circuit 180. According to one embodiment, circuit 100 receives input RF signals at input impedance matching circuit 110, amplifies the signal and transmits the amplified signal from output impedance matching circuit 120 to a load (not shown). In other embodiments, BJT 140 may comprise other solid state amplifying devices (e.g., HBT).

INPUT IMPEDANCE MATCHING CIRCUIT

Figure 2A:
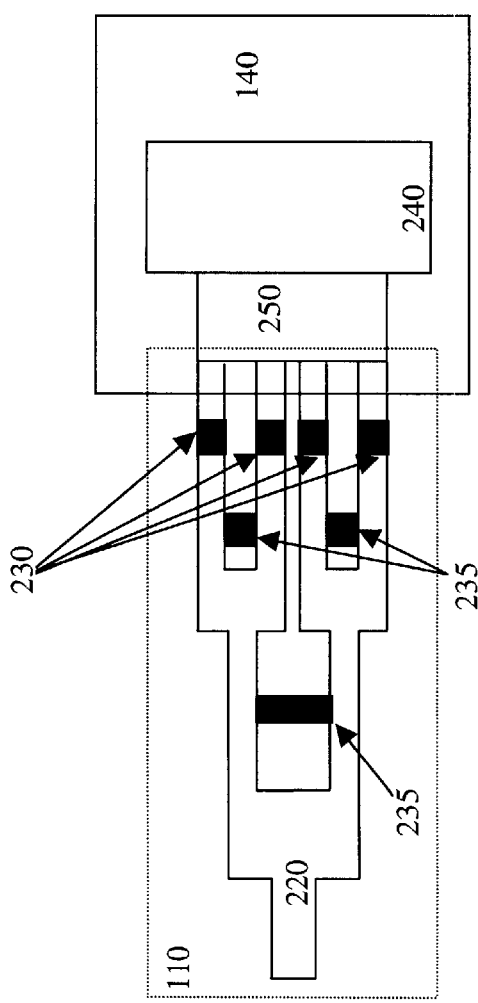
FIG. 2A is a diagram of one embodiment of a radio frequency power BJT coupled to an input impedance matching circuit.

As described above, input impedance matching circuit 110 is designed to receive RF signals. According to one embodiment, the impedance at the interface between the RF input and input impedance matching circuit 110 is 50 Ω. Input impedance matching circuit 110 transforms the impedance from the level of the RF input to the impedance of BJT 140. FIG. 2A is a diagram of BJT 140 coupled to input impedance matching circuit 110.

Referring to FIG. 2A, input impedance matching circuit 110 includes a multi-section "pitchfork feed" 220. According to one embodiment, pitchfork feed 220 is a printed trace that is configured to provide a balanced current feed into an input lead 250 of BJT 140. Typical printed traces are relatively wide single lines that feed input lead 250 of BJT 140. However, whenever circuit 100 is operating at high frequency there is typically a higher current density towards the outside edges of the wide single trace. Such an occurrence results in an unbalanced current feed into input lead 250 of BJT 140. Therefore, pitchfork feed 220 provides for balanced current flow into input lead 250 of BJT 140 by evenly dividing the current across multiple connected traces resulting in a more uniform current distribution into input lead 250 of BJT 140.

Input impedance matching circuit 110 also includes series resistors 230 within branches of the pitchfork feed 220 traces. Resistors 230 further equalize the current paths into input lead 250 of BJT 140 so that the current will not prefer one side of the pitchfork feed 220 to the others. In addition, resistors 230 reduce the likelihood of low frequency oscillation of the high frequency BYT 140. According to one embodiment, each resistor 230 has a 4.7 Ω resistance. Nevertheless, one of ordinary skill in the art will appreciate that other values for resistors 230 may be used.

Input impedance matching circuit 110 further includes resistors 235. Resistors 235 are placed pairs of branches of pitchfork feed 220 to further equalize the current between any two branches of pitchfork feed 220. For example, imbalances between the top two branches of pitchfork feed 220 are reduced by the resistor 235 between the two. According to one embodiment, each resistor 230 has a 100 resistance. Nevertheless, one of ordinary skill in the art will appreciate that other values for resistors 230 may be used.

OUTPUT IMPEDANCE MATCHING CIRCUIT

Figure 2B:
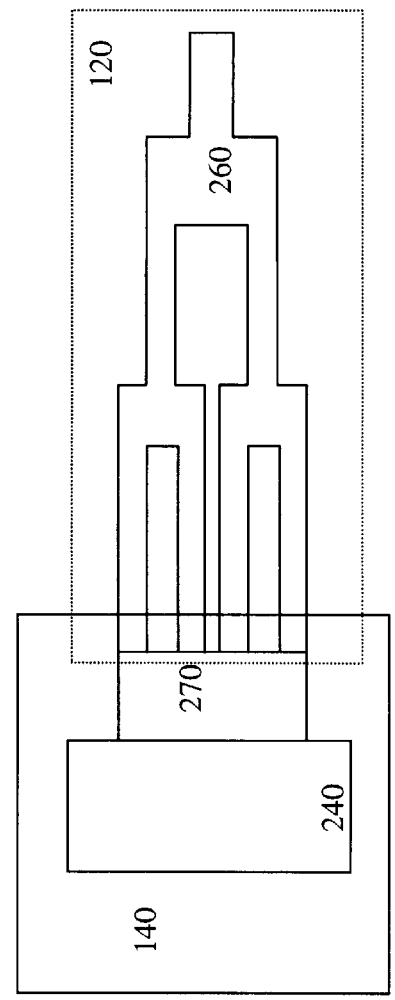
FIG. 2B is a diagram of one embodiment of a radio frequency power BJT coupled to an output impedance matching circuit.

Output impedance matching circuit 120 is coupled to an output lead 270 of BJT 140. Output impedance matching circuit 120 transforms the impedance from the level of output lead 270 of BJT 140 to the impedance level of load coupled to circuit 100. According to one embodiment, the impedance at the interface between output impedance matching circuit and the load is 50. FIG. 2B is a diagram illustrating output lead 270 of BJT 140 coupled to output impedance matching circuit 120.

Referring to FIG. 2B, output impedance matching circuit 120 includes a multi-section pitchfork feed 260 similar to pitchfork feed 220 in input impedance matching circuit 110. In addition to the advantages described above, the pitchfork feed 260 configuration in output impedance matching circuit 120 also presents a low impedance at the second and third harmonic frequencies to the output of BJT 140. The low impedance at the harmonic frequencies minimizes the RF voltage peaks at the output of BJT 140.

BASE BIAS CIRCUIT

Figure 3A:
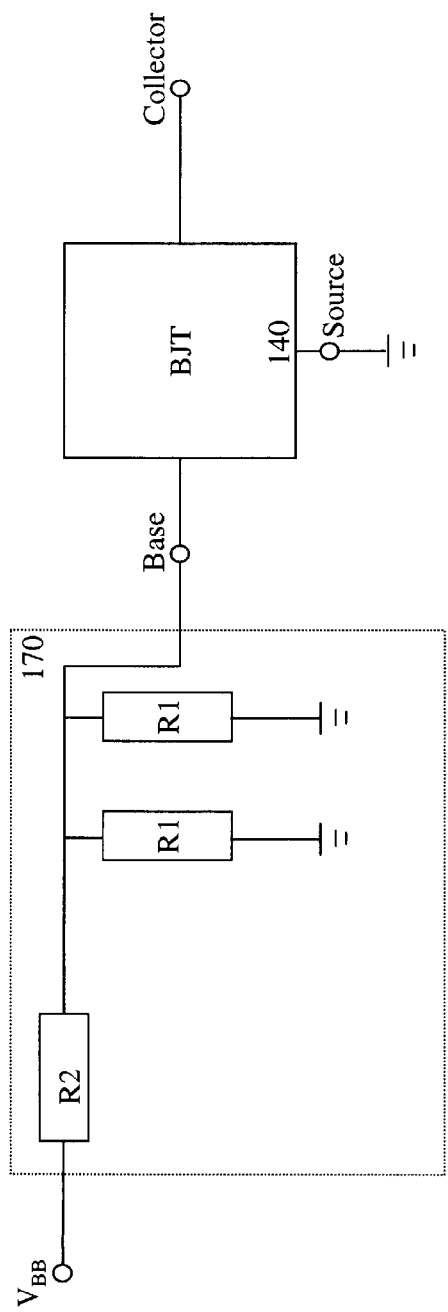
FIG. 3A is a diagram of one embodiment of a base bias circuit coupled to a radio frequency power BJT.

Base bias circuit 170 connects a power supply voltage to BJT 140 without having an affect on the RF signal amplified by BJT 140. According to one embodiment, base bias circuit 170 presents a low impedance, resistive load to the bases of BJT 140 at frequencies from 1 MHz to one-third of the operating RF frequency of BJT 140. In addition, base bias circuit 170 delivers the appropriate amount of DC current to the base of BJT 140 to optimize RF performance. FIG. 3A is a diagram of one embodiment of base bias circuit 170 coupled to BJT 140. According to one embodiment, bias circuit 170 includes a set of resistors. The resistors are coupled between a supply voltage ($V_{BB}$) and the base of BJT 140.

COLLECTOR BIAS CIRCUIT

Figure 3B:
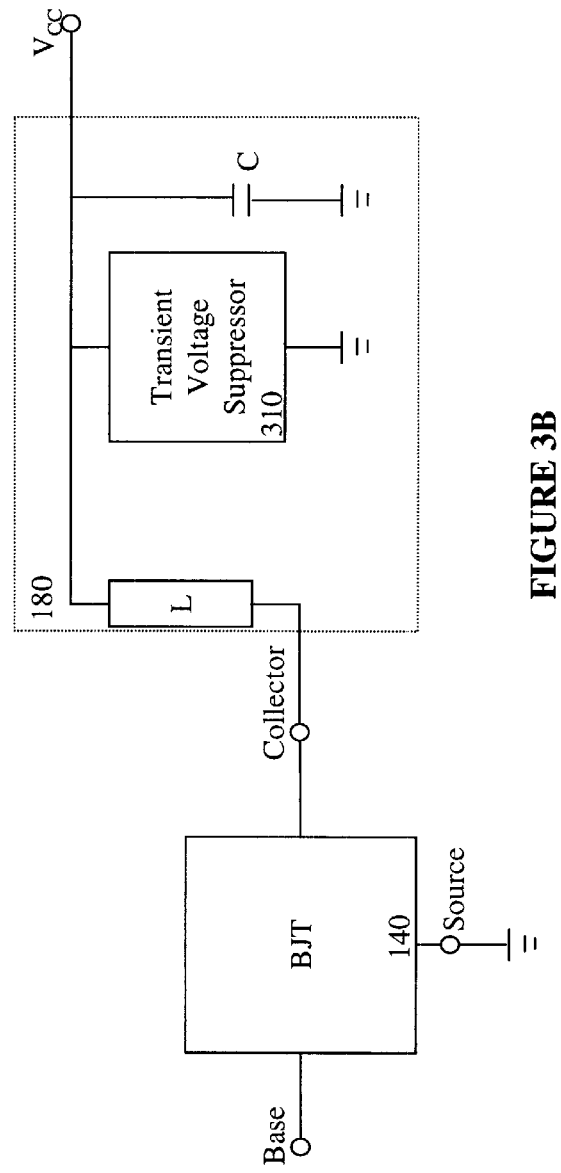
FIG. 3B is a diagram of one embodiment of a collector bias circuit coupled to a radio frequency power BJT.

Collector bias circuit 180 connects a DC power supply voltage to BJT 140 without affecting the RF signal amplified by BJT 140. According to one embodiment, bias circuit 180 results in uniform voltage across the entire lead 270 of BJT 140 coupled to the collectors of transistor 240. FIG. 3B is a diagram of one embodiment of collector bias circuit 180 coupled to BJT 140. Bias circuit 180 includes a transient voltage suppressor 310, a capacitor (C) and an inductor (L). Transient voltage suppressor 310 is connected between a supply voltage ($V_{cc}$) and ground.

According to one embodiment, $V_{cc}$ supplies 45–50 volts DC at 10A to the collector of BJT 140. Transient voltage suppressor 110 suppresses voltage spikes within circuit 100 caused during the switching between high and low current levels. In one embodiment, transient voltage suppressor 110 is implemented using a diode. However, one of ordinary skill in the art will appreciate that other fast voltage clipping devices may be used to implement transient voltage suppressor 110.

Inductor L is coupled between the supply voltage and BJT 140. Inductor L provides a predetermined impedance value that prevents RF current flow from BJT 140 through bias circuit 180. However, according to one embodiment, inductor L is designed to be sufficiently small so as to minimize voltage spikes caused by transient currents that occur due to changing current through the circuit. For example, whenever the output power of circuit 100 is quickly switched from low to high (e.g., 50 ns rise/fall time), or vice versa, the current flow through inductor L changes, resulting in a transient voltage spike. The larger the inductance of inductor L, the higher the magnitude of the voltage spike. In cases where the voltage spike is sufficiently large, severe damage to BJT 140 may occur. Therefore, the small size of inductor L and the presence of transient voltage suppressor 110 permits BJT 140 to operate at higher voltages (e.g., 50 volts).

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as the invention.

What is claimed is:

1. A method of enhancing the performance of a solid state power amplifying device, the method comprising:
controlling the distribution of an electromagnetic field across a single wide input lead of the solid state power amplifying device by using a first component comprised of a plurality of parallel narrow transmission lines coupled to the input lead of the solid state power amplifying device.

2. The method of claim 1 further comprising compensating for the distribution of an electromagnetic field across a single wide output lead of the solid state power amplifying device by using a second component comprised of a plurality of parallel narrow transmission lines coupled to the output lead of the solid state power amplifying device.

3. The method of claim 1 further comprising coupling a resistor within one or more of the plurality of narrow transmission lines.

4. The method of claim 1 further comprising coupling a resistor between two or more of the plurality of narrow transmission lines.

5. The method of claim 1 wherein the solid state power amplifying device is a bipolar junction transistor (BJT).

6. The method of claim 1 wherein the solid state power amplifying device is a heterojunction bipolar transistor (HBT).

7. The method of claim 1 wherein the solid state power amplifying device is a lateral diffused metal oxide semiconductor field effect transistor (LDMOS FET).

8. The method of claim 1 wherein the solid state power amplifying device is a vertical diffused metal oxide semiconductor field effect transistor (DMOS FET).

9. The method of claim 1 wherein the solid state power amplifying device is a metal semiconductor field effect transistor (MES FET).

10. The method of claim 1 wherein the solid state power amplifying device is a pseudomorphic high electron mobility field effect transistor (PHEMT FET).

11. The method of claim 1 wherein the solid state power amplifying device is a static inductance transistor (SIT).

12. An amplification circuit comprising:
a solid state power amplifying device; and
a first component, coupled to a single wide input lead of the solid state power amplifying device, having a plurality of parallel narrow transmission lines that control the distribution of an electromagnetic field across the input lead of the solid state power amplifying device.

13. The circuit of claim 12 further comprising:
a single wide output lead coupled to the output of the solid state power amplifying device; and
a second component, coupled to the output lead of the solid state power amplifying device, having a plurality of parallel narrow transmission lines that compensate for the distribution of an electromagnetic field across the output lead of the solid state power amplifying device.

14. The circuit of claim 12 further comprising a resistor coupled within one or more of the plurality of narrow transmission lines of the first component.

15. The circuit of claim 12 further comprising a resistor coupled between two or more of the plurality of narrow transmission lines of the first component.

16. The circuit of claim 12 further comprising:
a radio frequency source coupled to the input of the first component; and
a load coupled to the output of the second component.

17. The circuit of claim 16 further comprising an output bias circuit coupled to the solid state power amplifying device.

18. The circuit of claim 17 wherein the output bias circuit comprises a transient voltage suppressor.

19. The circuit of claim 17, further comprising an input bias circuit coupled to the amplifying device and the first flat transmission line.

20. The circuit of claim 12 wherein the solid state power amplifying device comprises a lateral diffused metal oxide semiconductor field effect transistor (LDMOS FET).

21. The circuit of claim 12 wherein the solid state power amplifying device comprises a vertical diffused metal oxide semiconductor field effect transistor (DMOS FET).

22. The circuit of claim 12 wherein the solid state power amplifying device is a metal semiconductor field effect transistor (MES FET).

23. The circuit of claim 12 wherein the solid state power amplifying device is a pseudomorphic high electron mobility field effect transistor (PHEMT FET).

24. The circuit of claim 12 wherein the solid state power amplifying device is a static inductance transistor (SIT).

25. The method of claim 12 wherein the solid state power amplifying device is a bipolar junction transistor (BJT).

26. The method of claim 12 wherein the solid state power amplifying device is a heterojunction bipolar transistor (HBT).

* * * * *